United States Patent
Ito

(10) Patent No.: US 7,326,644 B2
(45) Date of Patent: Feb. 5, 2008

(54) SEMICONDUCTOR DEVICE AND METHOD OF FABRICATING THE SAME

(75) Inventor: Shinya Ito, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/763,315

(22) Filed: Jan. 23, 2004

(65) Prior Publication Data
US 2004/0157469 A1 Aug. 12, 2004

(30) Foreign Application Priority Data
Jan. 28, 2003 (JP) .............................. 2003-019410

(51) Int. Cl.
*H01L 21/4763* (2006.01)
(52) U.S. Cl. .............................. 438/630; 257/E21.199; 438/663; 438/664; 438/682
(58) Field of Classification Search ................ 438/630, 438/663, 664, 682; 257/E21.199
See application file for complete search history.

(56) References Cited

U.S. PATENT DOCUMENTS 6,100,145 A * 8/2000 Kepler et al. ............... 438/300
6,133,130 A * 10/2000 Lin et al. ..................... 438/586
6,162,689 A * 12/2000 Kepler et al. ................ 438/299
6,258,651 B1 * 7/2001 Jenq et al. ................... 438/238
6,413,861 B1 * 7/2002 Huang et al. ................ 438/682
6,420,770 B1 * 7/2002 Xiang et al. ................. 257/506
6,448,167 B1 * 9/2002 Wang et al. ................. 438/595
6,468,904 B1 * 10/2002 Chen et al. .................. 438/682
6,518,136 B2 * 2/2003 Lee et al. .................... 438/303

FOREIGN PATENT DOCUMENTS

| JP | 3-14241 | 1/1991 |
| JP | 3-79033 | 4/1991 |
| JP | 11-340456 | 12/1999 |
| JP | 2001-85683 | 3/2001 |

* cited by examiner

*Primary Examiner*—Asok Kumar Sarkar
(74) *Attorney, Agent, or Firm*—Scully, Scott, Murphy & Presser, P.C.

(57) ABSTRACT

A method of fabricating a semiconductor device, includes (a) forming an oxide film entirely over a silicon substrate on which a MOS transistor is fabricated, (b) carrying out first thermal-annealing to the silicon substrate, (c) removing the oxide film in an area where later mentioned silicide is to be formed, (d) forming a metal film entirely over the silicide substrate, (e) carrying out second thermal-annealing to the silicon substrate to form silicide in the area, and (f) removing the metal film having been not reacted with the silicon substrate.

16 Claims, 6 Drawing Sheets

SEMICONDUCTOR DEVICE AND METHOD OF FABRICATING THE SAME

BACKGROUND OF THE INVENTION

1. Field of the Invention

The invention relates to a semiconductor device including a MOS transistor, and a method of fabricating the same, and more particularly to a semiconductor device including a MOS transistor having semiconductor-metal compound such as silicide therein, and a method of fabricating the same.

2. Description of the Related Art

Salicide is often applied to a CMOS semiconductor device in order to reduce a parasitic resistance. In salicide, a silicide film is formed on a gate electrode and source/drain regions. Specifically, in salicide, a metal film such as a titanium (Ti) or cobalt (Co) film is formed on silicon or polysilicon, and the metal film and silicon or polysilicon are thermally annealed to thereby have the metal film reacted with silicon for forming alloy of the metal and silicon. By forming such alloy, it is possible to reduce a parasitic resistance in a desired area, ensuring a high operation speed of a semiconductor device.

Apart from salicide, shallow trench isolation (STI) is often used for accomplishing device isolation by an area smaller than an area of a conventional LOCOS oxide film. In shallow trench isolation, a trench is formed in a semiconductor substrate by etching, and then, the trench is filled with electrical insulator to thereby form an electrically insulating film by which an area where a semiconductor device is to be fabricated is electrically isolated from other areas. The thus formed electrically insulating film is deeper and thicker than a conventional LOCOS oxide film.

FIG. 1 is a cross-sectional view of a MOSFET having a salicide structure and including an electrically insulating film formed by shallow trench isolation (STI).

With reference to FIG. 1, the illustrated MOSFET is comprised of a silicon substrate 101 including a well region 102, a shallow trench isolation (STI) film 103 formed in the silicon substrate 101 for electrically isolating the well region 102 from other regions, a gate oxide film 104 formed on the well region 102, a gate electrode 105 composed of polysilicon and formed on the gate oxide film 104, a sidewall oxide film 106 formed on a sidewall of the gate electrode 105, source/drain regions 108 formed in the well region 102 around the gate electrode 105, and a metal silicide film 113 formed on the gate electrode 105 and the source/drain regions 108.

In the salicide-structured MOSFET having the shallow trench isolation film 103, the shallow trench isolation film 103 is often made thinner in a step of forming the shallow trench isolation film 103 and/or a step of carrying out wet-etching, resulting in that a recess 111 grows larger at a shoulder of the shallow trench isolation film 103. This causes a problem that if silicidation is carried out under the condition that the recess 111 is large, the metal silicide film 113 would be formed in the vicinity of the recess 111 or covering the recess 111 therewith with the result of leakage at an interface at which the source/drain regions 108 and the well region 102 make contact with each other.

FIGS. 2A to 2H are cross-sectional views of the MOSFET illustrated in FIG. 1, showing respective steps in a method of fabricating the same.

Hereinbelow is explained the above-mentioned problem with reference to FIGS. 1 and 2A to 2H.

As illustrated in FIG. 2A, a silicon nitride (SiN) film 121 is formed on the silicon substrate 101 by a thickness of about 150 nanometers by CVD. Then, the silicon nitride film 121 is formed with an opening through which the shallow trench isolation film 103 will be formed. Then, the silicon substrate 101 is etched with the silicon nitride film 121 being used as a mask, to thereby form a trench through the opening. The trench has a depth in the range of about 300 to 600 nanometers.

Then, there is formed a thermal oxidation film (not illustrated) over the silicon substrate 101 by a thickness of 3 to 50 nanometers. Then, an oxide film 122 is formed in the trench by CVD, as illustrated in FIG. 2A.

Then, an oxide film formed on the silicon nitride film 121 by CVD is removed by chemical mechanical polishing (CMP), as illustrated in FIG. 2B.

Then, as illustrated in FIG. 2C, the silicon nitride film 121 is removed by wet-etching through the use of phosphoric acid. Thus, there is formed the shallow trench isolation film 103 having a thickness in the range of about 450 to 750 nanometers by which regions in each of which a semiconductor device is fabricated are electrically isolated from one another.

Then, ions are implanted into the silicon substrate 101, and the silicon substrate 101 is thermally annealed for activating the thus implanted ions. As a result, the well region 102 is formed in the silicon substrate 101, as illustrated in FIG. 2D.

Then, an oxide film resulted from the thermal annealing by a thickness of about 3 to 50 nanometers is removed by etching. Since the shallow trench isolation film 103 is also etched at a surface thereof by the etching, the shallow trench isolation film 103 is made thinner.

Then, as illustrated in FIG. 2E, an oxide film 123 is formed entirely over the silicon substrate 101 by a thickness of 1 to 20 nanometers. Then, polysilicon 124 is deposited on the oxide film 123 by a thickness of about 200 nanometers.

Then, the polysilicon 124 and the oxide film 123 are etched into a gate electrode. Thus, as illustrated in FIG. 2F, there are formed the gate oxide film 104 and the gate electrode 105.

Then, as illustrated in FIG. 2G, an oxide film 125 having a thickness of about 10 to 20 nanometers is formed entirely over the silicon substrate 101.

Then, the oxide film 125 is etched into the sidewall 106, as illustrated in FIG. 2H.

Then, ions are implanted into the well region 102 with the gate electrode 105 and the sidewall 106 being used as a mask. Thereafter, the silicon substrate 101 is thermally annealed for activating the ions having been implanted to the well region 102. Thus, the source/drain regions 108 are formed around the gate electrode 105. A surface oxide film having been formed by the thermal annealing by a thickness of about 3 to 50 nanometers is removed by etching. In the etching of the surface oxide film, since the shallow trench isolation film 103 is also etched at a surface thereof, the shallow trench isolation film 103 is made thinner with the result of a large recess 111 at a shoulder of the shallow trench isolation film 103.

If silicidation is carried out for forming the metal silicide film 113 under the condition that the recess 111 is large at a shoulder of the shallow trench isolation film 103, the metal silicide film 113 would be formed covering the recess 111 therewith with the result of leakage at an interface at which the source/drain regions 108 and the well region 102 make contact with each other.

In order to avoid the above-mentioned problem, Japanese Patent Application Publication No. 2001-85683 has suggested a method of fabricating a semiconductor device, including the step of covering an exposed surface of the shallow trench isolation film 103 with an electrically insulating film having a resistance to wet-etching, such as a nitride film, when the shallow trench isolation film 103 has been just formed, as illustrated in FIG. 2C.

However, the shallow trench isolation film 103 is kept projected in the suggested method. Hence, the method is accompanied with a problem that if a multi-wiring structure is formed above the shallow trench isolation film 103, there would be formed a step which might break a wire or wires.

Though the MOSFET illustrated in FIG. 1 is designed to include the silicon substrate 101 and the metal silicide film 113, the above-mentioned problem in the MOSFET is found in a semiconductor device including a semiconductor substrate composed of semiconductor other than silicon, and a film composed of compound of the semiconductor and metal.

Japanese Patent Application Publication No. 3-14241 has suggested a method of fabricating a semiconductor device, including the steps of forming a trench at a surface of a silicon substrate, filling the trench with silicon oxide, thermally annealing the silicon substrate to thereby form a gate oxide film on the silicon substrate, implanting impurity into the silicon substrate with the gate oxide film being used as a mask, to thereby form an impurity-diffusion layer, removing the gate oxide film such that the impurity-diffusion layer is exposed, and forming a silicide film on the exposed impurity-diffusion layer in a selected area.

Japanese Patent Application Publication No. 3-79033 has suggested a method of fabricating a semiconductor device, including the steps of forming a trench isolation region in a semiconductor substrate, forming a silicide layer on the semiconductor substrate, and forming a diffusion layer below the silicide layer.

Japanese Patent Application Publication No. 11-340456 has suggested a semiconductor device including an electrically conductive first area formed at a surface of a semiconductor substrate, a device isolation region formed adjacent to the electrically conductive first area at a surface of the semiconductor substrate, a first protection film covering the device isolation region therewith, an electrically insulating film formed on the semiconductor substrate to cover both the electrically conductive first area and the first protection film, and having an opening through which the electrically conductive first area is exposed, an electrical conductor filling the opening therewith, and an electrically conductive second area formed on the electrically insulating film and electrically connected to the electrical conductor.

SUMMARY OF THE INVENTION

In view of the above-mentioned problem in the conventional semiconductor device, it is an object of the present invention to provide a semiconductor device having a shallow trench isolation film and including a MOS transistor having a silicide film which semiconductor device is capable of preventing leakage at a shoulder of a shallow trench isolation film.

It is also an object of the present invention to provide a method of fabricating such a semiconductor device.

In one aspect of the present invention, there is provided a method of fabricating a semiconductor device, including (a) forming an oxide film entirely over a semiconductor substrate on which a MOS transistor is fabricated, (b) carrying out first thermal-annealing to the semiconductor substrate, (c) removing the oxide film in an area where later mentioned semiconductor-metal compound is to be formed, (d) forming a metal film entirely over the semiconductor substrate, and (e) carrying out second thermal-annealing to the semiconductor substrate to form semiconductor-metal compound in the area.

It is preferable that the method further includes (f) removing the metal film having been not reacted with the semiconductor substrate.

For instance, the semiconductor substrate may be a silicon substrate, in which case, the semiconductor-metal compound is silicide.

For instance, the metal film may be composed of cobalt, tungsten or titanium.

It is preferable that the oxide film is formed by chemical vapor deposition (CVD) in the range of 300 to 500 degrees centigrade both inclusive by the thickness of 20 to 40 nanometers both inclusive.

It is preferable that the first thermal-annealing is carried out as spike rapid thermal annealing (RTA) by zero second in the range of 1000 to 1100 degrees centigrade.

It is preferable that the first thermal-annealing is carried out also for activating impurities having been implanted into source and drain regions of the MOS transistor, and for removing defects in the source and drain regions.

It is preferable that the method further includes forming a trench in the semiconductor substrate, and filling the trench with oxide to define an area in which a semiconductor device is to be fabricated.

In another aspect of the present invention, there is provided a semiconductor device including (a) a semiconductor substrate, (b) a first MOS transistor formed on the semiconductor substrate, and including semiconductor-metal compound formed in the semiconductor substrate, (c) a second MOS transistor formed on the semiconductor substrate, and (d) a film covering the second MOS transistor therewith for preventing semiconductor-metal compound from being formed in the semiconductor substrate.

For instance, the semiconductor substrate is a silicon substrate, in which case, the semiconductor-metal compound is silicide.

For instance, metal in the semiconductor-metal compound may be selected from cobalt, tungsten and titanium.

It is preferable that the film is comprised of an oxide film.

It is preferable that the oxide film is formed by chemical vapor deposition (CVD) in the range of 300 to 500 degrees centigrade both inclusive by the thickness of 20 to 40 nanometers both inclusive.

The semiconductor device may further include an interlayer insulating film including the film as a lower film, and wherein a wiring formed above the MOS transistor is electrically connected to the first MOS transistor through a contact plug formed throughout the interlayer insulating film, and the wiring is electrically connected to the second MOS transistor through a contact plug formed throughout the interlayer insulating film and the film.

The advantages obtained by the aforementioned present invention will be described hereinbelow.

In the present invention, a salicide-structured MOS transistor having a shallow trench isolation film is designed to have a non-silicide transistor region and a silicide transistor region. After the formation of a shallow trench isolation film and a sidewall of the MOS transistor, an oxide film is formed over a substrate by CVD such that only the non-silicide transistor region is covered with the oxide film. By forming the oxide film thin, it would be possible to shorten a period of time necessary for etching the oxide film, ensuring the shallow trench isolation film is etched to a minimum degree, and hence, a recess of the oxide film, formed at a shoulder of the shallow trench isolation film, is prevented from becoming deeper. Thus, it is possible to minimize or prevent leakage among semiconductor devices caused by the recess.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

Figure 1:
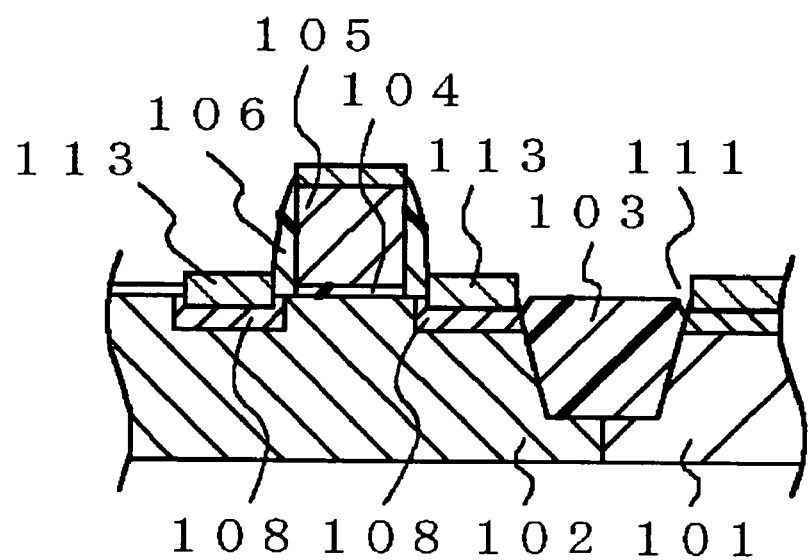
FIG. 1 is a cross-sectional view of a semiconductor device fabricated in accordance with a conventional method.
Figure 2A:
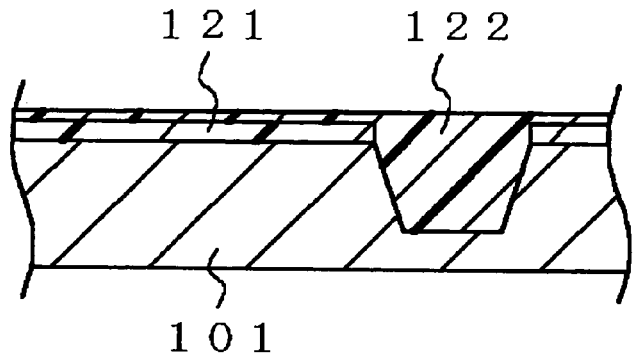
FIGS. 2A to 2H are cross-sectional views of the semiconductor device illustrated in FIG. 1, showing respective steps in a method of fabricating the same.
Figure 2B:
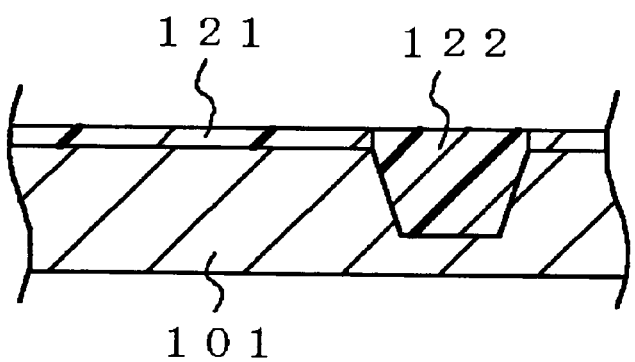
Figure 2C:
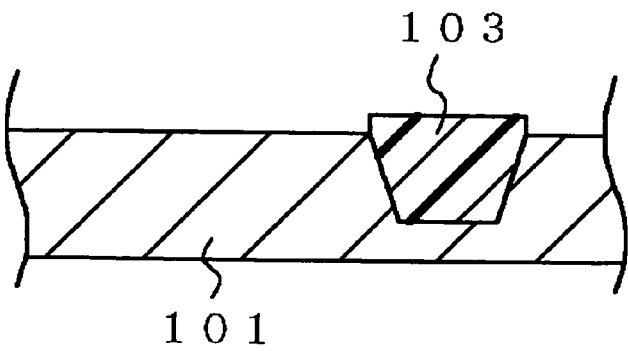
Figure 2D:
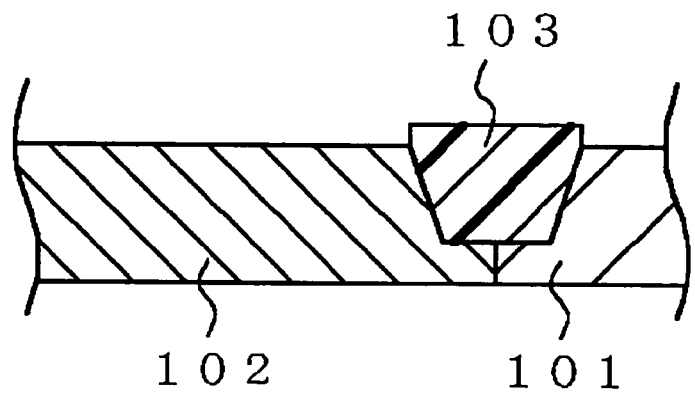
Figure 2E:
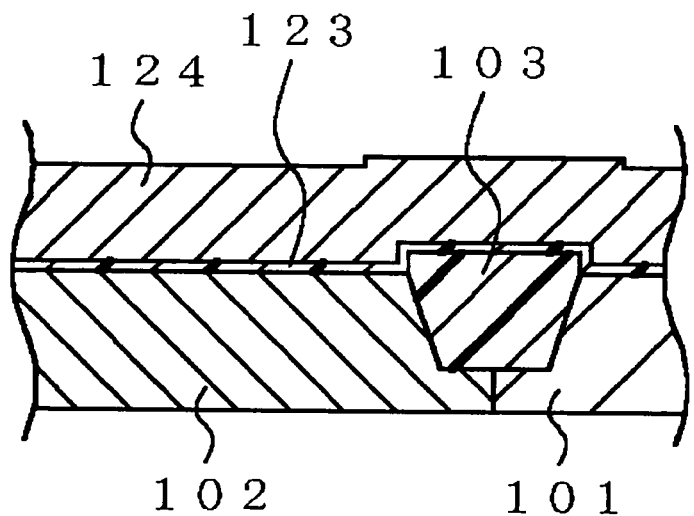
Figure 2F:
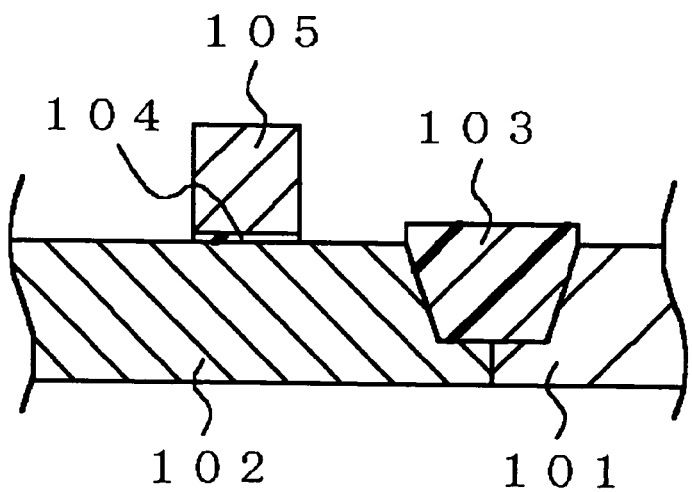
Figure 2G:
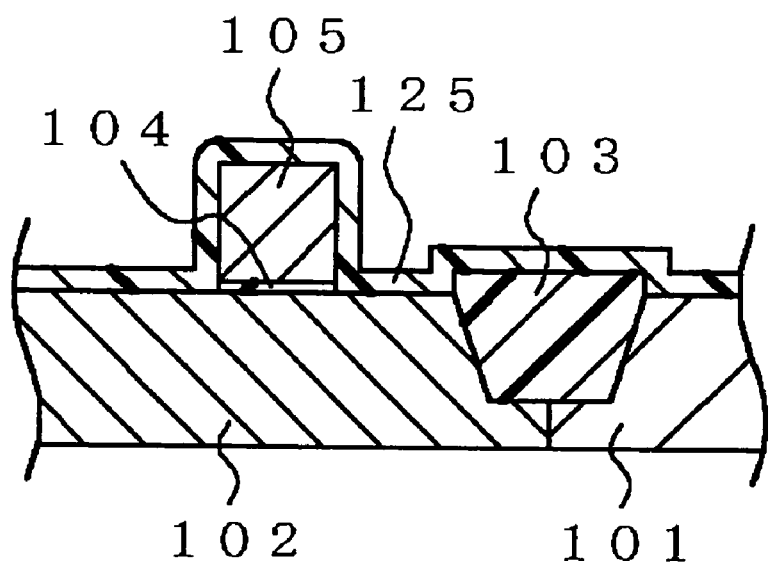
Figure 2H:
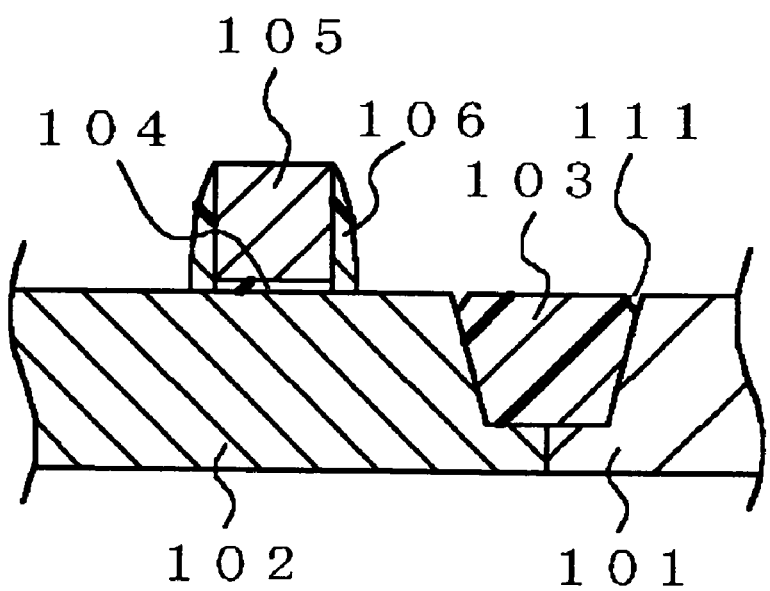

A preferred embodiment in accordance with the present invention will be explained hereinbelow with reference to drawings.

FIGS. 3A to 3F are cross-sectional views of a semiconductor device in accordance with an embodiment of the present invention, showing respective steps in a method of fabricating the same. Parts or elements that correspond to those of the MOSFET illustrated in FIGS. 1 and 2A to 2H have been provided with the same reference numerals.

Figure 3A:
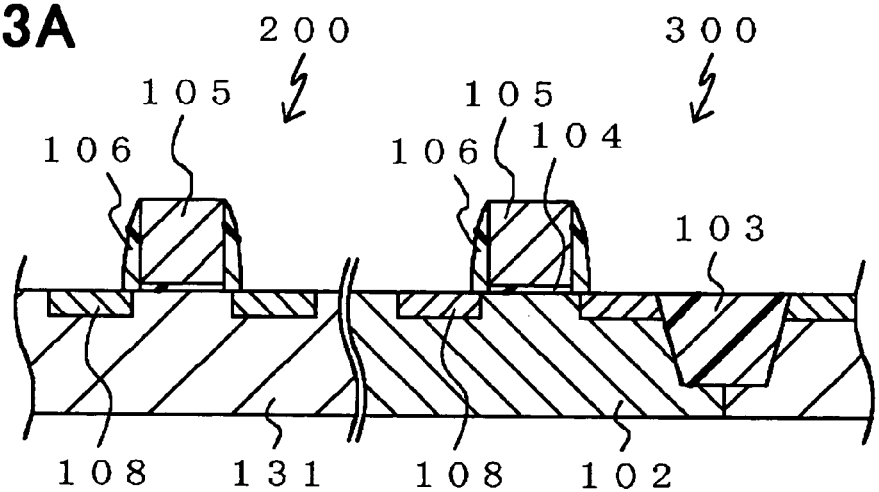
FIGS. 3A to 3F are cross-sectional views of a semiconductor device in accordance with an embodiment of the present invention, showing respective steps in a method of fabricating the same.

First, the steps having been explained with reference to FIGS. 2A to 2H are carried out to thereby form well regions 131 and 102 in a silicon substrate, a shallow trench isolation film 103 in the well region 102, and source/drain regions 108 in the well regions 131 and 102, as illustrated in FIG. 3A.

The source/drain regions 108 are formed by implanting impurity ions into the well regions 131 and 102 with the gate electrode 105 and the sidewall 106 both being used as a mask.

As illustrated in FIG. 3A, the MOSFET is designed to have a non-silicide transistor region 200 in which a metal silicide film is not formed, and a silicide transistor region 300 in which a later mentioned metal silicide film 113 is formed.

Figure 3B:
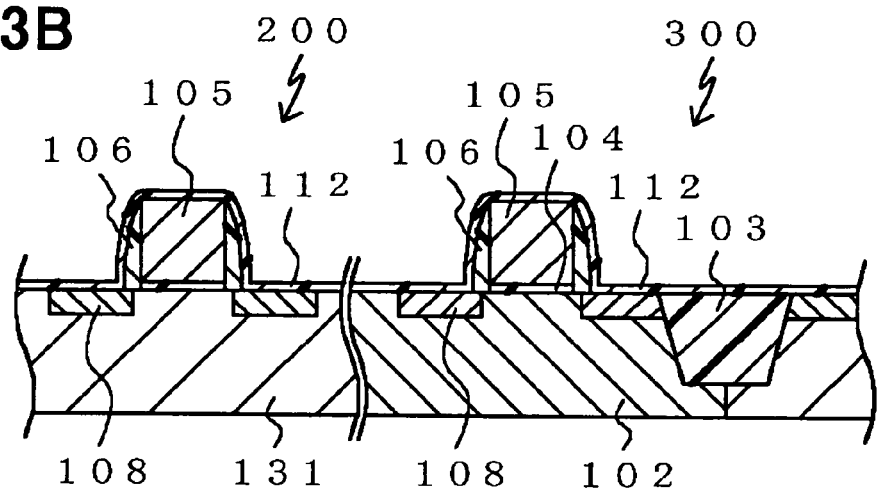

Then, as illustrated in FIG. 3B, an oxide film 112 is formed entirely over the silicon substrate by chemical vapor deposition (CVD) at 300 to 500 degrees centigrade by a thickness of 20 to 40 nanometers. Ion implantation for forming the source/drain regions 108 may be carried out after the formation of the oxide film 112.

Then, spike rapid thermal annealing (RTA) is carried out by zero second at 1000 to 1100 degrees centigrade in order to activate impurity ions having been implanted into the well regions 131 and 102 for forming the source/drain regions 108, and delete crystal defects caused by the ion implantation. As a result, the oxide film 112 has a reduced etching rate to wet-etching, and further has a reduced number of pin-holes therein. Accordingly, the oxide film 112 can be formed thin, specifically, the oxide film 112 can be formed to have a thickness in the range of 20 to 30 nanometers both inclusive.

The thus formed oxide film 112 prevents impurities having been implanted into the silicon substrate for forming the source/drain regions 108, from externally diffusing.

Figure 3C:
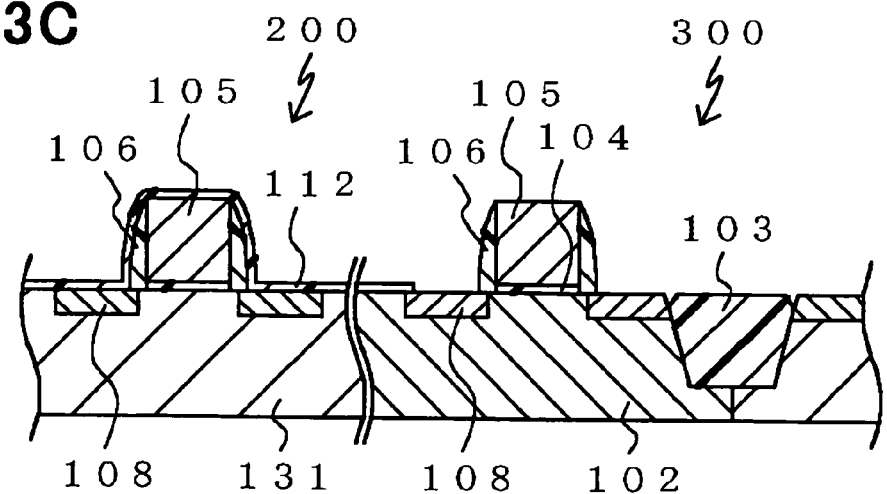

Then, a resist is deposited over the oxide film 112, and then, is patterned into a predetermined pattern by photolithography and etching. Then, the oxide film 112 is wet-etched through the use of hydrofluoric acid etchant with the patterned resist being used as a mask such that the oxide film 112 remains only in the non-silicide transistor region 200, as illustrated in FIG. 3C.

As mentioned earlier, since spike RTA was applied to the oxide film 112 at 1000 to 1100 degrees centigrade, the oxide film 112 had a reduced etching rate. If the oxide film 112 is formed thin, namely, form to have a thickness of 20 to 30 nanometers, it would be possible to shorten a period of time for patterning the oxide film 112 by wet-etching, which ensures that the shallow trench isolation film 103 is less influenced by the wet-etching, and thus, the recess 111 formed at a shoulder of the shallow trench isolation film 103 would have a small depth.

Though the oxide film 112 is wet-etched in the embodiment, the oxide film 112 may be dry-etched, because the oxide film 112 is thin, specifically, the oxide film 112 has a thickness of 20 to 30 nanometers, and hence, a period of time necessary for etching the oxide film 112 is quite short.

Figure 3D:
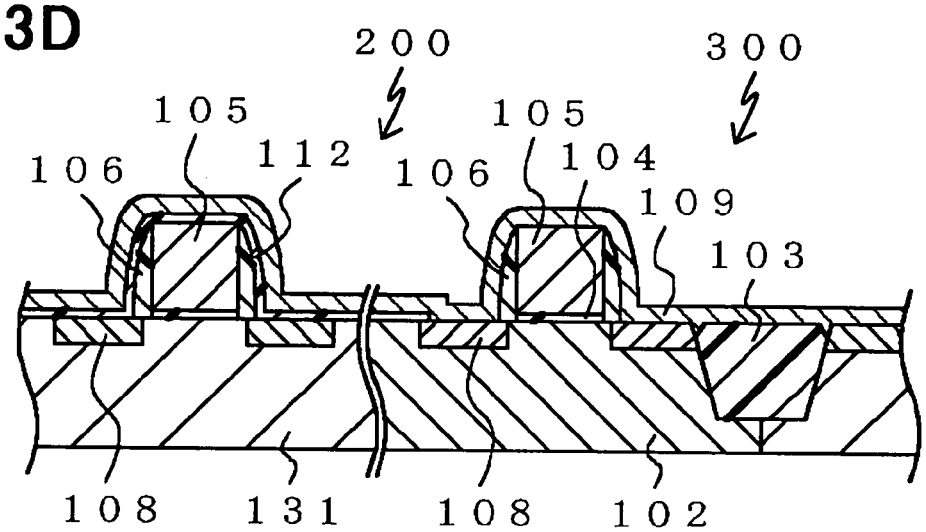

Then, as illustrated in FIG. 3D, a cobalt film 109 as a metal film for silicidation is formed entirely over the silicon substrate by deposition of cobalt. It should be noted that a tungsten (W) or titanium (Ti) film may be formed in place of the cobalt film 109.

Figure 3E:
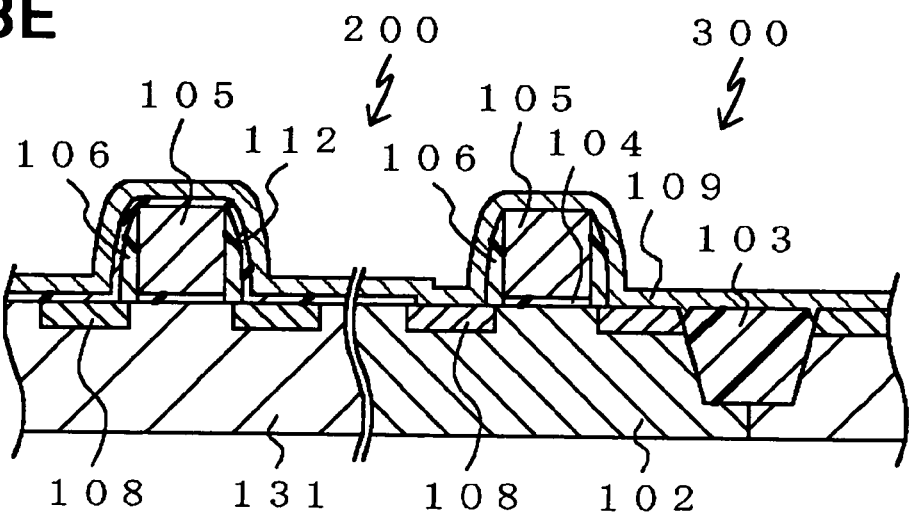

Then, as illustrated in FIG. 3E, the silicon substrate is thermally annealed at 650 to 700 degrees centigrade in 20 to 40 seconds in nitrogen atmosphere in order to change a portion of the cobalt film 109 at which the cobalt film 109 makes contact with the well region 102, into silicide. Thus, a silicide layer 113 is formed as a result of reaction of silicon in the well region 102 with cobalt in the cobalt film 109.

Figure 3F:
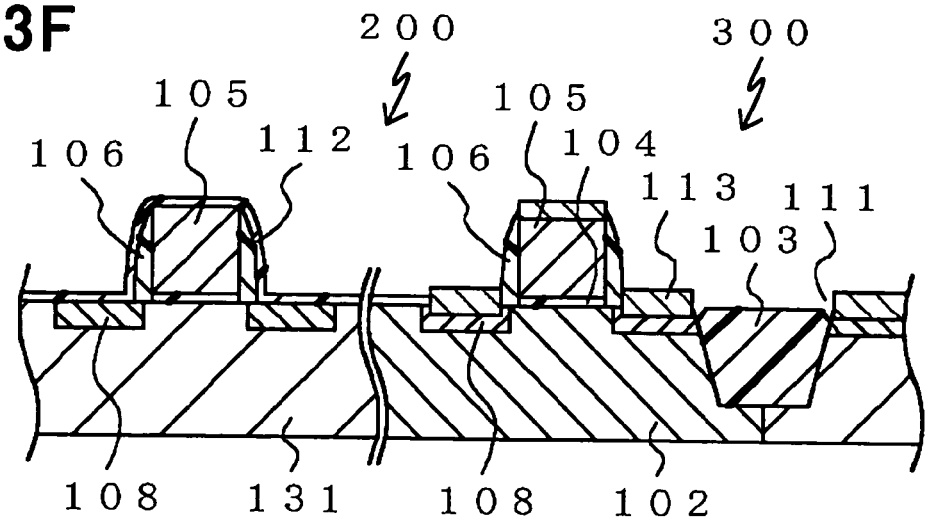

Then, as illustrated in FIG. 3F, the silicide layer 113 is patterned into a predetermined pattern necessary for forming a memory circuit, a logic circuit and so on in the silicide transistor region 300. Unnecessary portion of the cobalt film 109 is removed.

Then, an interlayer insulating film(s) and a wiring layer(s) (neither illustrated) are formed above the non-silicide transistor region 200 and the silicide transistor region 300, in which case, a semiconductor device fabricated in the non-silicide transistor region 200 is electrically connected to an upper wiring layer through a contact plug formed throughout the oxide film 112 and an interlayer insulating film formed on the oxide film 112, and a semiconductor device fabricated in the silicide transistor region 300 is electrically connected to an upper wiring layer through a contact plug formed throughout an interlayer insulating film formed above the semiconductor device.

Thus, there is completed the salicide-structured MOSFET including the shallow trench isolation film 103.

As mentioned above, in the semiconductor device having a salicide-structured MOS transistor and including a shallow trench isolation film, in accordance with the embodiment, the MOS transistor is separated into the non-silicide transistor region 200 and the silicide transistor region 300 after the shallow trench isolation film 103 and the sidewall 106 of the MOS transistor have been formed. The oxide film 112 is formed only in the non-silicide transistor region 200.

Since the oxide film 112 is formed thin, it would be possible to shorten a period of time necessary for etching the oxide film 112, ensuring the shallow trench isolation film 103 is etched to a minimum degree, and hence, the recess 111 of the oxide film 112, formed at a shoulder of the shallow trench isolation film 103, is prevented from becoming deeper. Thus, it is possible to minimize or prevent leakage among semiconductor devices caused by the recess 111.

Since the spike RTA is applied at a high temperature to the oxide film 112, the oxide film 112 has a reduced etching rate to wet-etching. Accordingly, it is possible to ensure that the shallow trench isolation film 103 is etched to a minimum degree, and hence, the recess 111 of the oxide film 112, formed at a shoulder of the shallow trench isolation film 103, is prevented from becoming deeper, because of the facts that the oxide film 112 is thin, and that the oxide film 112 has a small etching rate to wet-etching. Thus, it is possible to minimize or prevent leakage among semiconductor devices caused by the recess 111.

The semiconductor device in accordance with the embodiment is designed to include the silicon substrate and the metal silicide film 113. However, it should be noted that the semiconductor device in accordance with the embodiment may be designed to include a semiconductor substrate composed of semiconductor other than silicon, and a metal compound film composed of compound of semiconductor and metal.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2003-019410 filed on Jan. 28, 2003 including specification, claims, drawings and summary is incorporated herein by reference in its entirety.

What is claimed is:

1. A method of fabricating a semiconductor device, comprising:
    (a) forming an oxide film entirely over a semiconductor substrate on which a MOS transistor is fabricated;
    (b) carrying out spike rapid thermal annealing (RTA) as first therma-annealing to said semiconductor substrate;
    (c) selectively removing said oxide film in an area where later mentioned semiconductor-metal compound is to be formed while leaving oxide film in a non-silicide transistor region;
    (d) forming a metal film entirely over said semiconductor substrate; and carrying out second thermal-annealing to said semiconductor substrate to form semiconductor-metal compound in said area.

2. The method as set forth in claim 1, further comprising (f) removing said metal film having been not reacted with said semiconductor substrate.

3. The method as set forth in claim 1, wherein said semiconductor substrate is a silicon substrate, and said semiconductor-metal compound is silicide.

4. The method as set forth in claim 3, wherein said metal film is composed of cobalt, tungsten or titanium.

5. The method as set forth in claim 1, wherein said oxide film is formed by chemical vapor deposition (CVD) in the range of 300 to 500 degrees centigrade both inclusive by the thickness of 20 to 40 nanometers both inclusive.

6. The method as set forth in claim 1, wherein said spike rapid thermal annealing (RTA) is carried out by zero second in the range of 1000 to 1100 degrees centigrade.

7. The method as set forth in claim 1, wherein said first thermal-annealing is carried out also for activating impurities having been implanted into source and drain regions of said MOS transistor, and for removing defects in said source and drain regions.

8. The method as set forth in claim 1, further comprising:
    forming a trench in said semiconductor substrate; and
    filling said trench with oxide to define an area in which a semiconductor device is to be fabricated.

9. The method as set forth in claim 1 wherein said semiconductor device includes a shallow trench isolation (STI) film.

10. A method of fabricating a semiconductor device, comprising, in sequence:
    (a) forming a shallow trench isolation (STI) film on a semiconductor substrate;
    (b) implanting impurity ions into a well region with a gate electrode and a sidewall both being used as a mask to form source/drain regions;
    (c) forming an oxide film entirely over said semiconductor substrate on which a MOS transistor is fabricated;
    (d) carrying out first thermal-annealing to said semiconductor substrate;
    (e) selectively removing said oxide film in an area where later mentioned semiconductor-metal compound is to be formed while leaving said oxide film in a non-silicide transistor region;
    (f) forming a metal film entirely over said semiconductor substrate; and
    (g) carrying out second thermal-annealing to said semiconductor substrate to form semiconductor-metal compound in said area,
wherein no thermal-annealing steps are carried out between said (b) and (c) so as to prevent a recess at a shoulder of said shallow trench isolation film from deepening.

11. The method as set forth in claim 10, further comprising (f) removing said metal film having been not reacted with said semiconductor substrate.

12. The method as set forth in claim 10, wherein said semiconductor substrate is a silicon substrate, and said semiconductor-metal compound is silicide.

13. The method as set forth in claim 12, wherein said metal film is composed of cobalt, tungsten or titanium.

14. The method as set forth in claim 10, wherein said oxide film is formed by chemical vapor deposition (CVD) in the range of 300 to 500 degrees centigrade both inclusive by the thickness of 20 to 40 nanometers both inclusive.

15. The method as set forth in claim 10, wherein said first thermal-annealing is carried out as spike rapid thermal annealing (RTA) by zero second in the range of 1000 to 1100 degrees centigrade.

16. The method as set forth in claim 10, wherein said first thermal-annealing is carried out also for activating impurities having been implanted into source and drain regions of said MOS transistor, and for removing defects in said source and drain regions.

* * * * *